United States Patent
Ajgaonkar et al.

(10) Patent No.: US 12,422,758 B2
(45) Date of Patent: Sep. 23, 2025

(54) LITHOGRAPHIC APPARATUS, TEMPERATURE SENSOR, AND FIBER BRAGG GRATING SENSOR

(71) Applicants: ASML Holding N.V., Veldhoven (NL); ASML Netherlands B.V., Veldhoven (NL)

(72) Inventors: Mahesh Upendra Ajgaonkar, Guilford, CT (US); Gerardus Hubertus Petrus Maria Swinkels, Eindhoven (NL); Laurentius Johannes Adrianus Van Bokhoven, Bergeijk (NL); Joost André Klugkist, Waalre (NL); Koen Martin Willem Jan Bos, Eindhoven (NL)

(73) Assignee: ASML NETHERLANDS B.V. & ASML HOLDING N.V., Veldhoven (NL)

(*) Notice: Subject to any disclaimer, the term of this patent is extended or adjusted under 35 U.S.C. 154(b) by 136 days.

(21) Appl. No.: 18/284,161

(22) PCT Filed: Mar. 21, 2022

(86) PCT No.: PCT/EP2022/057360
§ 371 (c)(1),
(2) Date: Sep. 26, 2023

(87) PCT Pub. No.: WO2022/214302
PCT Pub. Date: Oct. 13, 2022

(65) Prior Publication Data
US 2024/0302753 A1   Sep. 12, 2024

Related U.S. Application Data

(60) Provisional application No. 63/172,312, filed on Apr. 8, 2021.

(51) Int. Cl.
*G03F 7/00* (2006.01)
*G01K 1/02* (2021.01)
(Continued)

(52) U.S. Cl.
CPC ......... *G03F 7/70891* (2013.01); *G01K 1/026* (2013.01); *G01K 7/22* (2013.01);
(Continued)

(58) Field of Classification Search
CPC .. G03F 7/70891; G03F 7/702; G03F 7/70233; G03F 7/70316; G03F 7/7085;
(Continued)

(56) References Cited

U.S. PATENT DOCUMENTS 10,656,538 B2 * 5/2020 Streefkerk .......... G03F 7/70341
10,812,143 B2 * 10/2020 Vannucci ................. H01P 3/10
(Continued)

FOREIGN PATENT DOCUMENTS

CN   104777717 A    7/2015
DE   102011086457 A1   12/2012

OTHER PUBLICATIONS

International Search Report and Written Opinion of the International Searching Authority directed to International Patent Application No. PCT/EP2022/057360, mailed Jul. 19, 2022; 10 pages.
(Continued)

*Primary Examiner* — Hung V Nguyen
(74) *Attorney, Agent, or Firm* — Sterne, Kessler, Goldstein & Fox P.L.L.C.

(57) ABSTRACT

A lithographic apparatus includes an illumination system, a projection system, a temperature-sensitive object, and a temperature sensor that includes a detector and waveguide device that is thermally coupled to the temperature-sensitive object and includes an input end, a downstream end, and first and second scattering features. The illumination system
(Continued)

illuminates a pattern of a patterning device. The projection system projects an image of the pattern onto a substrate. Based on temperature, the first scattering feature reflects a first spectrum. Radiation not reflected by the first scattering feature is allowed downstream. Based on temperature, the second scattering feature reflects a second spectrum different from the first spectrum. Radiation not reflected by the second scattering feature is allowed downstream. The detector is disposed to receive radiation including the reflected first and second spectra from the input end and generates a measurement signal based on the received radiation.

17 Claims, 14 Drawing Sheets

(51) Int. Cl.
*G01K 7/22* (2006.01)
*G01K 11/3206* (2021.01)
(52) U.S. Cl.
CPC .......... *G01K 11/3206* (2013.01); *G03F 7/702* (2013.01); *G03F 7/70233* (2013.01); *G03F 7/70316* (2013.01); *G03F 7/7085* (2013.01)
(58) Field of Classification Search
CPC . G03F 7/70858; G03F 7/70875; G01K 1/026; G01K 7/22; G01K 11/3206
See application file for complete search history.

(56) References Cited

U.S. PATENT DOCUMENTS

2008/0049202 A1    2/2008  Kraehmer
2010/0033704 A1*   2/2010  Shiraishi ............. G03F 7/70266
                                                        355/71

OTHER PUBLICATIONS

International Preliminary Report on Patentability directed to International Patent Application No. PCT/EP2022/057360, issued Oct. 10, 2023; 8 pages.
Hilgersom et al., "Three-dimensional dense distributed temperature sensing for measuring layered thermohaline systems," AGU Publications, Water Resource Research, Aug. 16, 2016; pp. 6656-6670.
Suarez et al., "Assessment of a vertical high-resolution distributed-temperature-sensing system in a shallow thermohaline environment," Hydrol. Earth Syst. Sci., vol. 15, Mar. 30, 2011; pp. 1081-1093.
Utsunomiya et al., "Monitoring of Dimensional Stability of CFRP Mirrors for Space Telescopes by Using Embedded FBG Sensors," Japan Aerospace Exploration Agency, Jan. 2009; 8 pages.
Research Disclosure No. 596069, Nov. 25, 2023; 9 pages.
Research Disclosure No. 608029, Nov. 12, 2014; 6 pages.

* cited by examiner

LITHOGRAPHIC APPARATUS, TEMPERATURE SENSOR, AND FIBER BRAGG GRATING SENSOR

CROSS-REFERENCE TO RELATED APPLICATIONS

This application claims priority of U.S. Provisional Patent Application No. 63/172,312, which was filed on Apr. 8, 2021, and which is incorporated herein in its entirety by reference.

FIELD

The present disclosure relates to lithographic apparatuses and methods thereof. For example, projection optical elements, which may be used to direct EUV radiation in a lithographic process to fabricate semiconductor devices, may be subjected to heat management processes.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

A lithographic apparatus typically includes an illumination system that conditions radiation generated by a radiation source before the radiation is incident upon a patterning device. A patterned beam of EUV light can be used to produce extremely small features on a substrate. Extreme ultraviolet light (also sometimes referred to as soft x-rays) is generally defined as electromagnetic radiation having wavelengths in the range of about 5-100 nm. One particular wavelength of interest for photolithography occurs at 13.5 nm.

Methods to produce EUV light include, but are not necessarily limited to, converting a source material into a plasma state that has a chemical element with an emission line in the EUV range. These elements can include, but are not necessarily limited to, xenon, lithium and tin.

In one such method, often termed laser-produced plasma ("LPP"), the desired plasma can be produced by irradiating a source material, for example, in the form of a droplet, stream or wire, with a laser beam. In another method, often termed discharge-produced plasma ("DPP"), the required plasma can be generated by positioning source material having an appropriate emission line between a pair of electrodes and causing an electrical discharge to occur between the electrodes.

One technique for fabricating ICs involves projecting a patterned beam of EUV radiation onto a substrate. The projection optics can use reflectors. Since the EUV beam may not be perfectly uniform in terms of cross-sectional intensity, the optical energies absorbed by the reflectors may be non-uniform, leading to reflectors developing local temperature differences and subsequent deformations. Distorted wavefronts of reflected light can arise from using mirrors that have such temperature-induced deformations. This can add to the error budget, reducing marketability and competitive edge of affected thermally sensitive components.

One method of treating non-uniformities of thermally sensitive objects may involve using a targeted heating system and temperature sensors. Temperature sensors can generate information on temperature non-uniformities in the thermally sensitive object and the heating system can supply heating energy (e.g., a laser) to relatively low-temperature areas of the thermally sensitive object based on the information provided by the temperature sensors. While conventional temperature sensors (e.g., thermistors) can be used, such conventional temperatures can present a variety of problems (e.g., structural implementation difficulty, limited scalability, electrical noise, or the like).

SUMMARY

Accordingly, it is desirable to improve temperature-sensing techniques to increase accuracy of temperature correction methods and reduce error tolerances on thermally sensitive objects, for example, in projection optics of lithographic apparatuses.

In some embodiments, a lithographic apparatus comprises an illumination system, a projection system, a temperature-sensitive object, and a temperature sensor. The illumination system is configured to illuminate a pattern of a patterning device. The projection system is configured to project an image of the pattern onto a substrate. The temperature sensor is thermally coupled to the temperature-sensitive object. The temperature sensor comprises a waveguide device and a detector. The waveguide comprises an input end, a downstream end opposite the input end, and first and second scattering features. The first scattering feature is configured to reflect a first spectrum based on a temperature at the first scattering feature. Radiation not reflected by the first scattering feature is allowed to propagate downstream. The second scattering feature is configured to reflect a second spectrum based on a temperature at the second scattering feature. Radiation not reflected by the second scattering feature is allowed to propagate downstream. The detector is disposed to receive radiation comprising the reflected first and second spectra from the input end and to generate a measurement signal based on the received radiation.

In some embodiments, a system comprises a temperature-sensitive object, a temperature sensor, and a controller. The temperature sensor comprises a waveguide device and a detector. The temperature sensor is thermally coupled to the temperature-sensitive object. The waveguide device comprises an input end, a downstream end opposite the input end, and first and second scattering features. The first scattering feature is configured to reflect a first spectrum based on a temperature at the first scattering feature. Radiation not reflected by the first scattering feature is allowed to propagate downstream. The second scattering feature is configured to reflect a second spectrum based on a temperature at the second scattering feature. Radiation not reflected by the second scattering feature is allowed to propagate downstream. The detector is disposed to receive radiation comprising the reflected first and second spectra from the input end and to generate a measurement signal based on the received radiation. The controller is configured to receive the measurement signal and to generate a control signal based on the measurement signal.

In some embodiments, a method comprises disposing a waveguide device having one or more scattering features in thermal communication with a heating source. The method further comprises propagating radiation through the waveguide device. The method further comprises receiving radiation reflected by the one or more scattering features at a detector, the reflected radiation comprising reflected spectra corresponding to the one or more scattering features. The method further comprises correlating the reflected spectra to the temperature of the waveguide device. The method further comprises adjusting a temperature of the heating source. The method further comprises correlating adjusted reflected spectra corresponding to the one or more scattering features to the adjusted temperature.

Further features of various embodiments of the present disclosure are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

Figure 1:
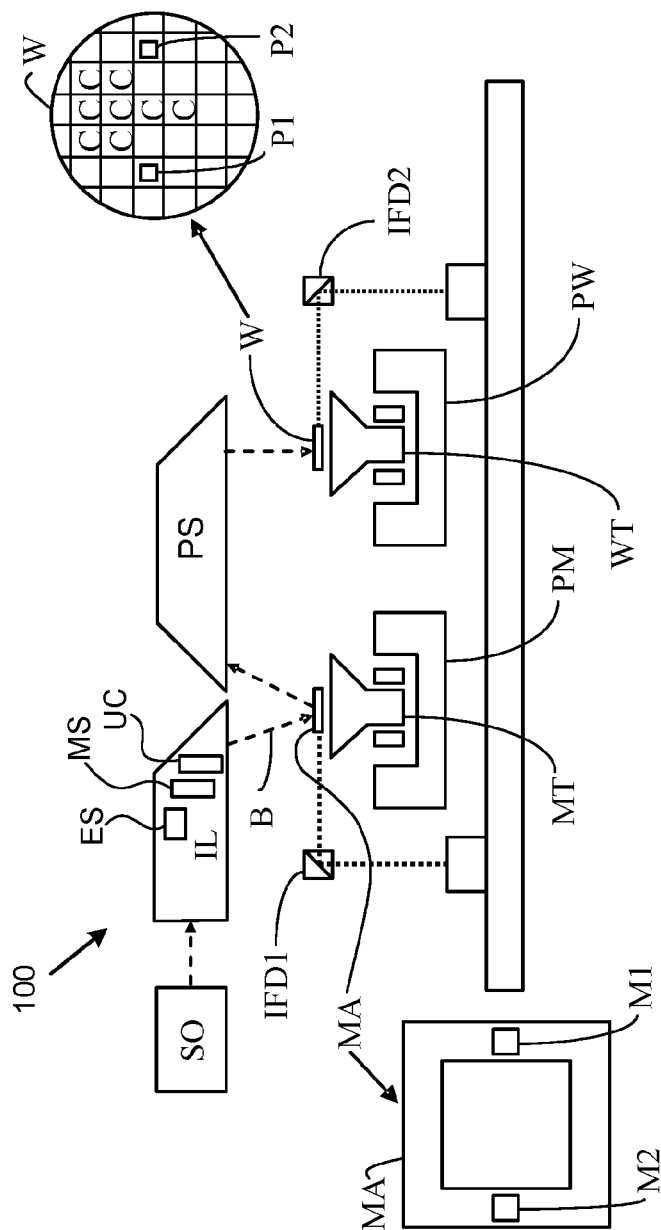
FIG. 1 illustrates a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" can be used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

FIG. 1 shows a schematic illustration of a lithographic apparatus 100 in which embodiments of the present disclosure can be implemented. Lithographic apparatus 100 includes the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 also has a projection system PS configured to project a pattern imparted to the radiation beam B by patterning device MA onto a target portion (for example, comprising one or more dies) C of the substrate W. In lithographic apparatus 100, the patterning device MA and the projection system PS are reflective.

The illumination system IL can include various types of optical components, such as refractive, reflective, catadioptric, magnetic, electromagnetic, electrostatic, or other types of optical components, or any combination thereof, for directing, shaping, or controlling the radiation beam B. The illumination system IL can also include a sensor ES that provides a measurement of, for example, one or more of energy per pulse, photon energy, intensity, average power, and the like. The illumination system IL can include a measurement sensor MS for measuring a movement of the radiation beam B and uniformity compensators UC that allow an illumination slit uniformity to be controlled. The measurement sensor MS can also be disposed at other locations. For example, the measurement sensor MS can be on or near the substrate table WT.

The support structure MT holds the patterning device MA in a manner that depends on the orientation of the patterning device MA with respect to a reference frame, the design of lithographic apparatus 100, and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA can be reflective. Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The illuminator IL receives a radiation beam from a radiation source SO. The source SO and the lithographic apparatus 100 can be separate physical entities, for example, when the source SO is an excimer laser. In such cases, the source SO is not considered to form part of the lithographic apparatus 100 and the radiation beam B passes from the source SO to the illuminator IL with the aid of a beam delivery system BD (not shown) including, for example, suitable directing mirrors and/or a beam expander. In other cases, the source SO can be an integral part of the lithographic apparatus 100, for example, when the source SO is a mercury lamp. The source SO and the illuminator IL, together with the beam delivery system BD, if required, may be referred to as a radiation system.

To not overcomplicate the drawing, the illuminator IL can include other components that are not shown. For example, the illuminator IL can include an adjuster for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. The illuminator IL can comprise an integrator and/or a condenser (not shown). The illuminator IL can be used to condition the radiation beam B to have a desired uniformity and intensity distribution in its cross section. The desired uniformity of radiation beam B can be maintained by using a uniformity compensator. Uniformity compensator comprises a plurality of protrusions (e.g., fingers) that can be adjusted in the path of radiation beam B to control the uniformity of radiation beam B. A sensor can be used to monitor the uniformity of radiation beam B.

The radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

The lithographic apparatus 100 can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes EUV radiation source configured to generate a beam of EUV radiation for EUV lithography. In general, the EUV radiation source is configured in a radiation system, and a corresponding illumination system is configured to condition the EUV radiation beam of the EUV source.

Figure 2A:
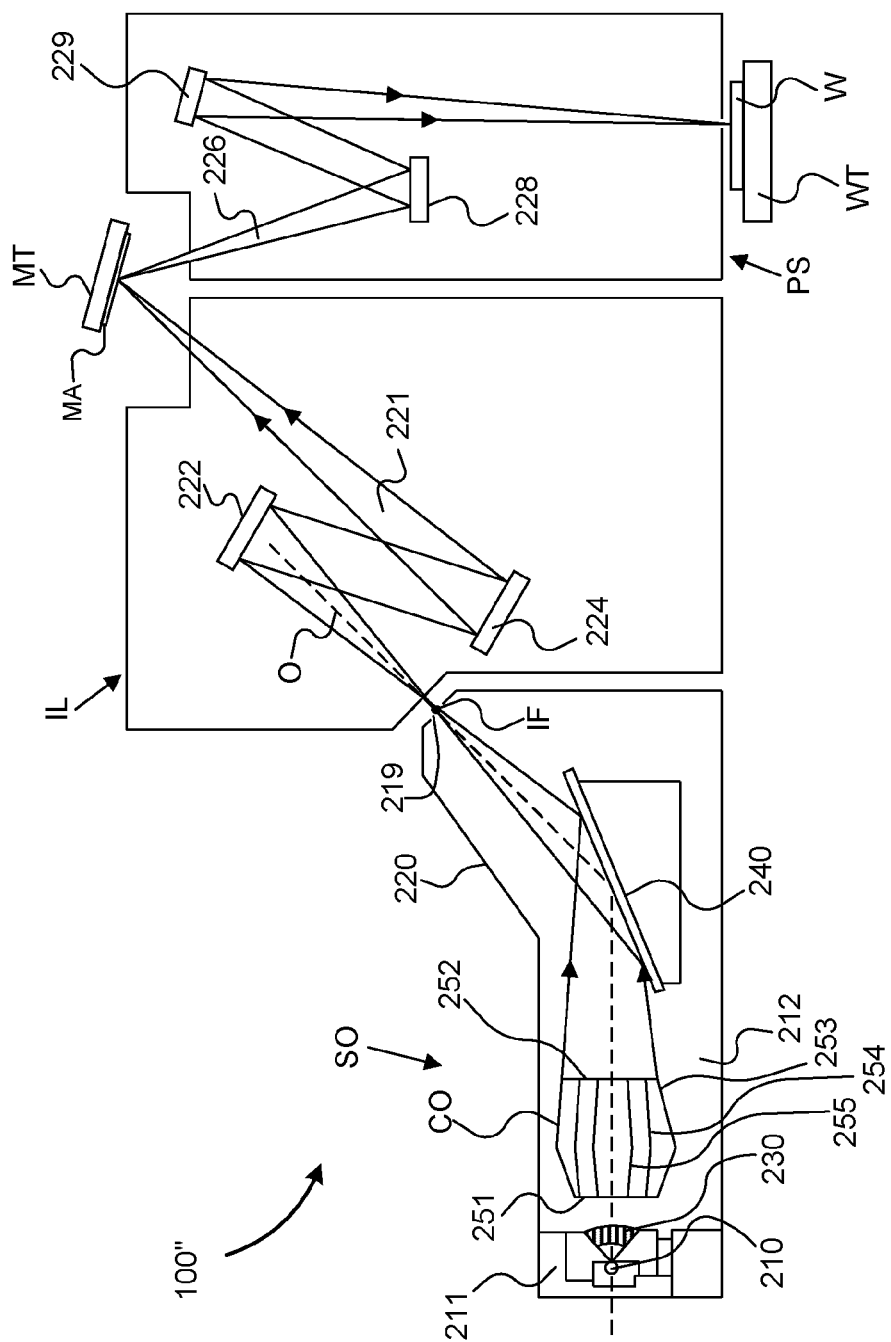
FIGS. 2A and 2B illustrate a reflective lithographic apparatus, according to some embodiments.

FIG. 2A shows the lithographic apparatus 100 (e.g., FIG. 1) in more detail, including the source collector apparatus SO, the illumination system IL, and the projection system PS, according to some embodiments. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) (e.g., excited via a laser) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2A, for example there can be one to six additional reflective elements present in the projection system PS than shown in FIG. 2A.

In some embodiments, illumination optics unit IL can include a sensor ES that provides a measurement of, for example, one or more of energy per pulse, photon energy, intensity, average power, and the like. Illumination optics unit IL can include a measurement sensor MS for measuring a movement of the radiation beam B and uniformity compensators UC that allow an illumination slit uniformity to be controlled. The measurement sensor MS can also be disposed at other locations. For example, the measurement sensor MS can be on or near the substrate table WT.

Collector optic CO, as illustrated in FIG. 2A, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Figure 2B:
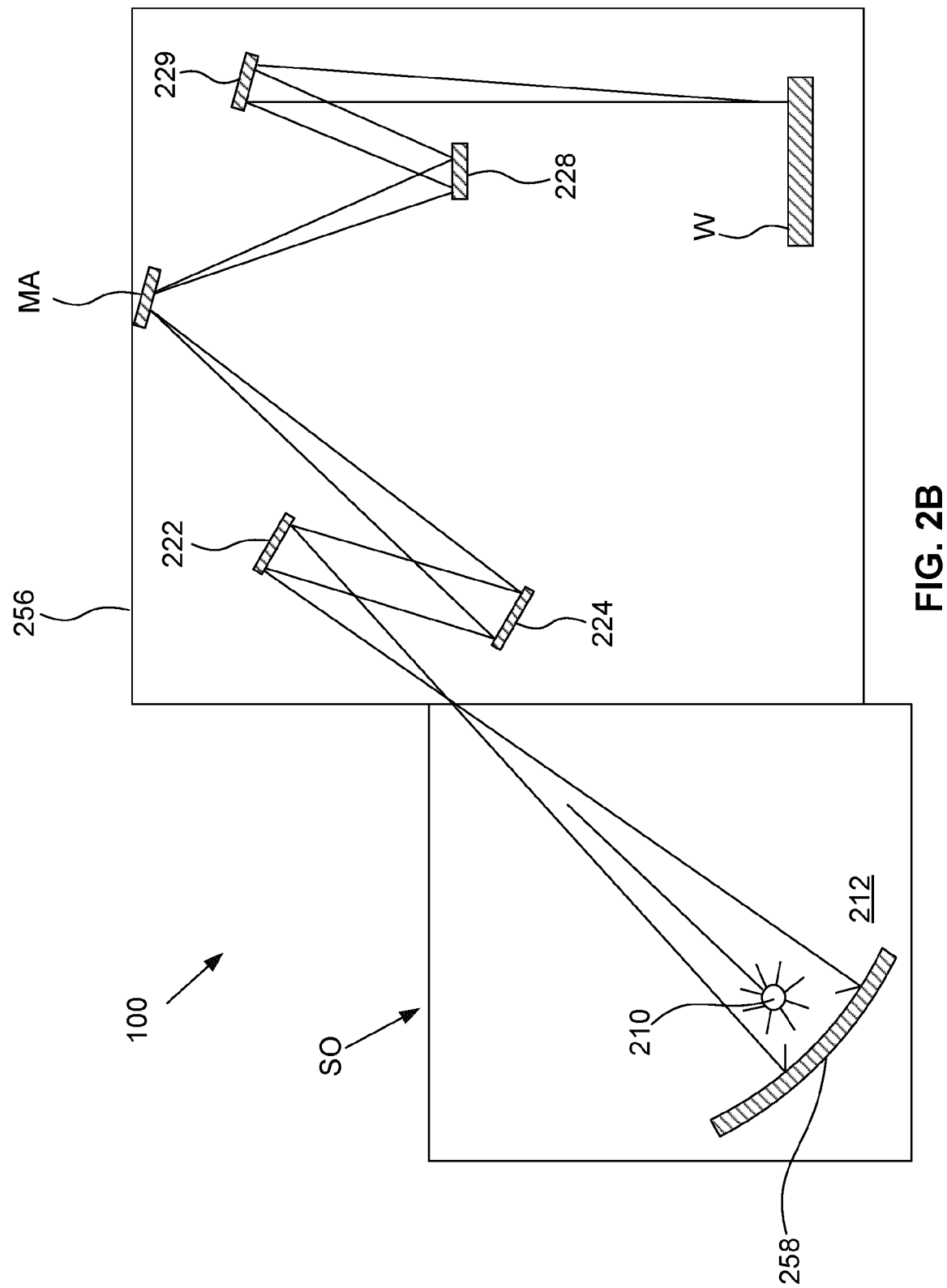

FIG. 2B shows a schematic view of selected portions of lithographic apparatus 100 (e.g., FIG. 1), but with alternative collection optics in the source collector apparatus SO, according to some embodiments. It should be appreciated that structures shown in FIG. 2A that do not appear in FIG. 2B (for drawing clarity) can still be included in embodiments referring to FIG. 2B. Elements in FIG. 2B having the same reference numbers as those in FIG. 2A have the same or substantially similar structures and functions as described in reference to FIG. 2A. In some embodiments, the lithographic apparatus 100 can be used, for example, to expose a substrate W such as a resist coated wafer with a patterned beam of EUV light. In FIG. 2B, the illumination system IL and the projection system PS are represented combined as an exposure device 256 (e.g., an integrated circuit lithography tool such as a stepper, scanner, step and scan system, direct write system, device using a contact and/or proximity mask, etc.) that uses EUV light from the source collector apparatus SO. The lithographic apparatus 100 can also include collector optic 258 that reflects EUV light from the hot plasma 210 along a path into the exposure device 256 to irradiate the substrate W. Collector optic 258 can comprise a near-normal incidence collector mirror having a reflective surface in the form of a prolate spheroid (i.e., an ellipse rotated about its major axis) having, e.g., a graded multi-layer coating with alternating layers of Molybdenum and Silicon, and in some cases, one or more high temperature diffusion barrier layers, smoothing layers, capping layers and/or etch stop layers.

Exemplary Lithographic Cell

Figure 3:
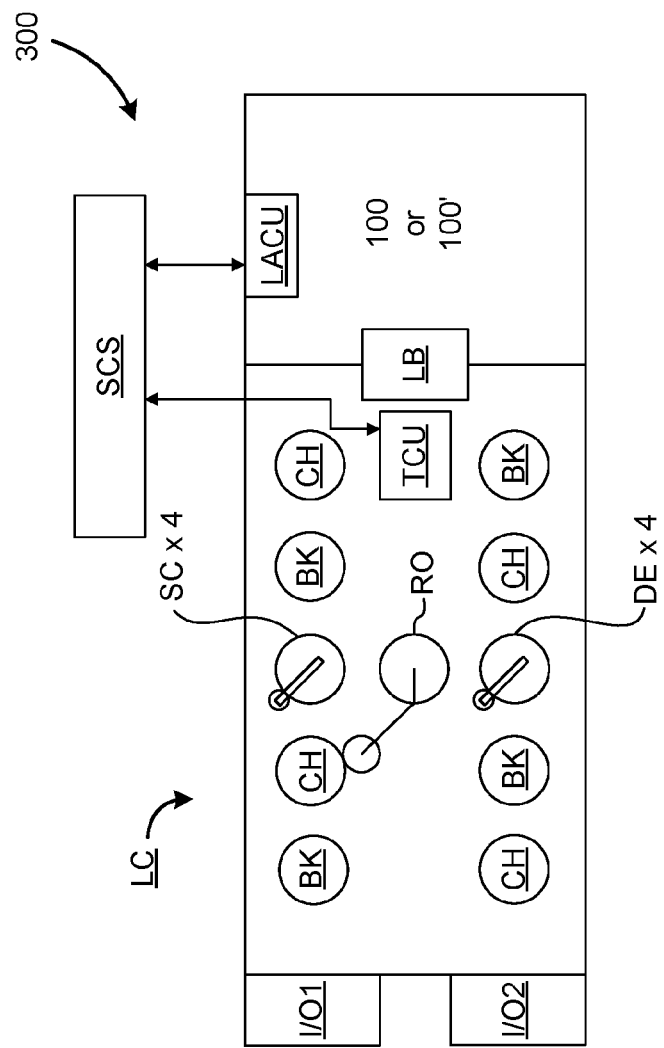
FIG. 3 illustrates a lithographic cell, according to some embodiments.

FIG. 3 shows a lithographic cell 300, also sometimes referred to a lithocell or cluster, according to some embodiments. Lithographic apparatus 100 can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Temperature Control Systems

There are numerous technology spaces in which variations and/or non-uniformities in temperature of tools can impact device performance and/or execution of temperature-sensitive processes. One example can be found in EUV lithographic apparatuses. Reflectors receiving EUV radiation can develop non-uniform heating of their optical surfaces. Errors (e.g., deformities) caused by non-uniform local temperatures of the optical surface can impact lithographic accuracy, reducing pattern transfer quality and decreasing device yields (e.g., non-conforming devices are discarded or otherwise wasted). Temperature sensors can be used to generate information regarding temperature non-uniformities in the thermally sensitive object. A temperature control system can adjust local temperatures by supplying heat (e.g., using a laser) and/or removing heat (e.g., using a cooling system) based on the information provided by the temperature sensors. While conventional temperature sensors (e.g., thermistors) can be used, these can present a variety of problems (e.g., structural limitations, limited scalability, electrical noise, or the like).

Figure 4A:
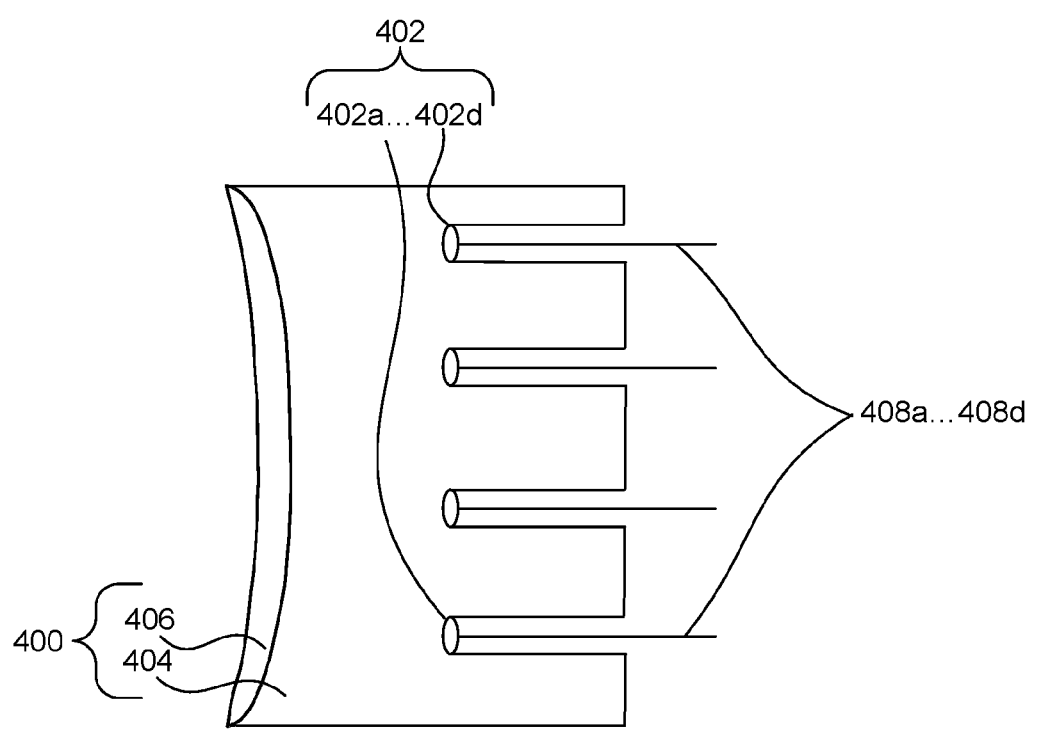
FIGS. 4A and 4B illustrate a temperature sensor array, according to some embodiments.
Figure 4B:
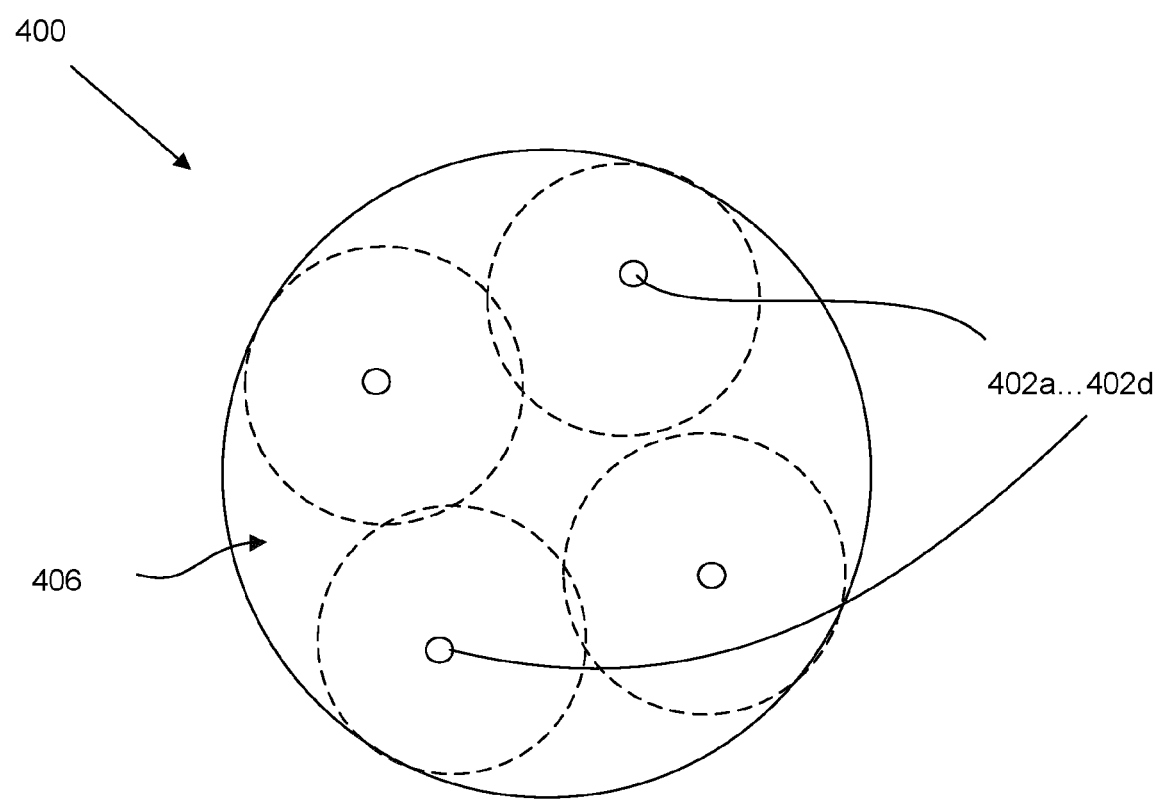

FIGS. 4A and 4B show an object 400 and a temperature sensor array 402, according to some embodiments. In some embodiments, object 400 can be, for example, an optical element that receives radiation (e.g., faceted field mirror device 222, faceted pupil mirror device 224, reflective elements 228 or 229 (FIG. 2A or 2B), or the like). Object 400 can comprise a body 404 and a surface 406. Surface 406 can be an optical surface (e.g., a reflective surface). FIG. 4A illustrates a side view and the arrangement of temperature sensor array 402 relative to the side view. FIG. 4B illustrates a see-through frontal view of surface 406 and the arrangement of temperature sensor array 402 relative to the frontal view. FIGS. 4A and 4B illustrate alternative or combinable arrangements.

In some embodiments, object 400 can be any manner of object having issues relating to temperature variations and/or non-uniformity regardless of whether or not the temperature variations and/or non-uniformity is caused by direct exposure to optical energy (e.g., mask table MT, wafer table WT (FIG. 1), a support structure, a sensor frame, actuated stages, substrates having reflective and/or transmission patterns that are used for system metrology functions, or the like). For example, object 400 can be a device that is disposed in a system that is unrelated to lithography. In some embodiments, other sources of temperature variations and/or non-uniformity could include heat dissipation of electronics, surrounding gas flows, or the like.

In some embodiments, object 400 is a temperature-sensitive object. In the context of devices and hardware, the term "temperature-sensitive" can be used herein to refer to a structure that is susceptible to performance variations based on temperature variations of the structure. For example, object 400 can develop temperature variations and/or non-uniformity, thereby causing undesirable effects. For example, if object 400 is an optical element, temperature variations and/or non-uniformity can cause the optical element to warp, thereby introducing optical aberrations when using the optical element. Hence, object 400 can be referred to as a temperature-sensitive object and surface 406 can be referred to as a temperature-sensitive surface.

In some embodiments, temperature sensor array 402 can comprise temperature sensor elements 402a to 402d. Temperature sensor array 402 can be thermally coupled to object 400. For example, temperature sensor array 402 can be in contact with object 400, temperature sensor array 402 can be embedded within body 404 (as illustrated in FIG. 4A), temperature sensor array 402 can be affixed to a surface of object 400, or the like. In embodiments in which surface 406 is an optical surface, it can be detrimental to dispose temperature sensor array 402 on surface 406. Additionally, body 404 can be a thick block, thereby causing difficulties to measure temperatures of surface 406 by affixing temperature sensor array 402 on a backside (e.g., side opposite to surface 406) of object 400. Therefore, body 404 can comprise recesses through which temperature sensor elements 402a to 402d can be inserted. In this manner, temperature sensor elements 402a to 402d can be disposed proximal to surface 406 through the backside of object 400. The recesses in body 404 can be manufactured using any suitable technique (e.g., drilled, molded, or the like). The proximity of temperature sensor elements 402a to 402d to surface 406 can allow temperature sensor array to sense local temperatures of different regions of surface 406. Approximate sensing regions are illustrated by dashed circles in FIG. 4B.

In some embodiments, four temperature sensor elements are disclosed as a non-limiting example (e.g., as shown in FIGS. 4A and 4B). It should be appreciated that the number of temperature sensor elements can be different from four, for example, to accommodate specific structural and sensing constraints. Temperature sensor array 402 can further comprise wiring 408a to 408d electrically coupled to corresponding temperature sensor elements 402a to 402d. Each of temperature sensor elements 402a to 402d can comprise a thermistor, for example a negative temperature coefficient (NTC) resistor. Wiring 408a to 408d can be coupled to an electrical monitoring device(s) (e.g., ammeter, multimeter, or the like) (not shown). As surface 406 absorbs different amounts of heat energy (e.g., from a beam of radiation), the electrical monitoring device(s) can sense local variations of temperature.

In some embodiments, it can be desirable to obtain a high-resolution temperature or heat map of surface 406. However, the temperature data provided by four temperature sensor elements (point sensors) may be insufficient or too coarse to obtain the high-resolution temperature map. One technique to overcome this limitation can be to implement a higher density of temperature sensor elements. A problem of such an implementation can be that object 400 may not be able to support a large number of recesses for a high-density temperature sensor implementation. For a typical thermistor, a recess can have dimensions (e.g., depth, diameter, or the like) in the order of millimeters or tens of millimeters. Higher densities of thermistors can result in removal of a sizable portion of mass from body 404, thereby causing object 400 to become structurally unstable. In an example, the structural instability can exacerbate the warping effects under temperature variations and/or non-uniformity, rendering object 400 unusable for its intended purpose. Furthermore, conventional temperature sensors, such as thermistors, can introduce a host of additional undesirable issues (e.g., undesirable heating via electrical currents running through the sensor, electrical interference on wiring 408a to 408d, or the like).

To address the above-discussed limitations of some conventional temperature sensor elements, in some embodiments, waveguides with scattering features can be configured as a distributed temperature sensor.

Figure 5A:
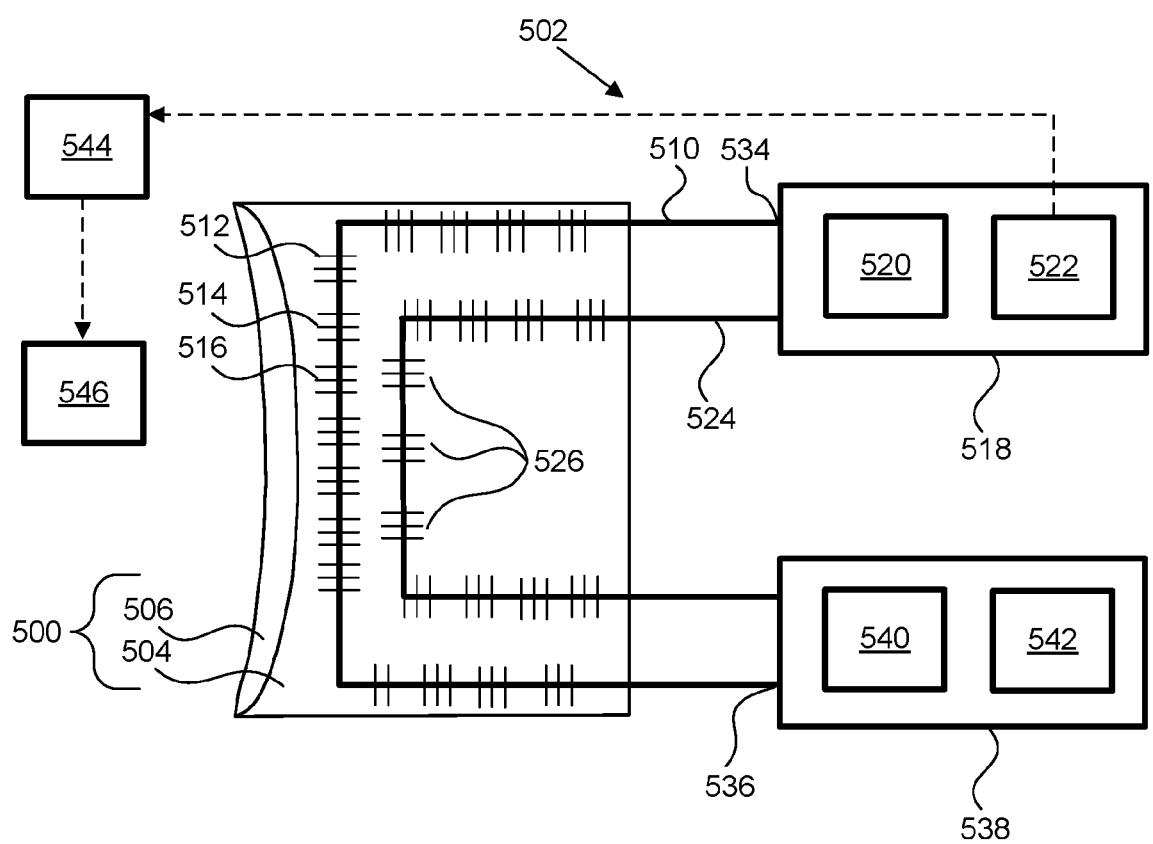
FIGS. 5A and 5B illustrate a temperature sensor array, according to some embodiments.
Figure 5B:
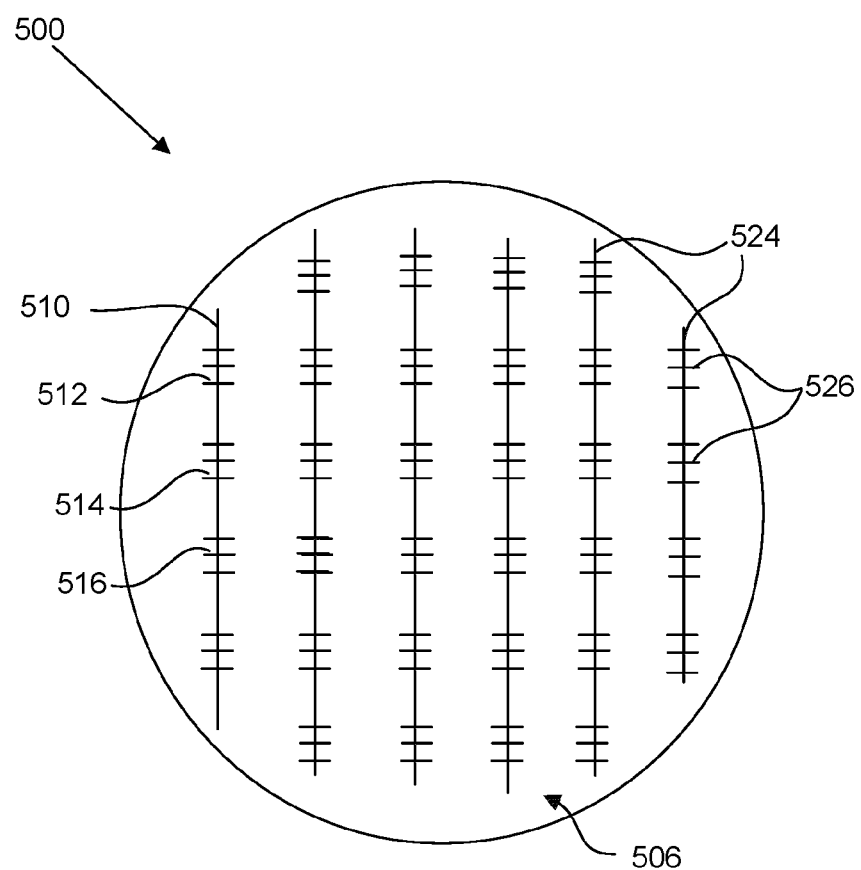

FIGS. 5A and 5B show an object 500 and a temperature sensor 502, according to some embodiments. In some embodiments, object 500 can comprise a body 504 and a surface 506. Unless otherwise noted, object 500, body 504, and surface 506 can have similar structures and functions as similarly numbered elements in FIG. 4 (e.g., object 400, body 404, and surface 406), and therefore redundant descriptions will not be repeated. FIG. 5A illustrates a side view and the arrangement of temperature sensor 502 relative to the side view. FIG. 5B illustrates a see-through frontal view of surface 506 and the arrangement of temperature sensor 502 relative to the frontal view. FIGS. 5A and 5B illustrate alternative or combinable arrangements (e.g., waveguides at different depths and/or side-by-side).

In some embodiments, temperature sensor 502 can comprise a waveguide device 510. Waveguide device 510 can comprise a scattering feature 512 (e.g., a first scattering feature), and a scattering feature 514 (e.g., a second scattering feature). The term "waveguide device" or the like can be used herein to refer to a device that can propagate radiation by confining the radiation in a cavity and/or medium. An example of a waveguide device is an optical fiber. The optical fiber can be single-mode or multimode. Another example of a waveguide device is a microwave cavity. Yet another example of a waveguide device is a strip of light-transmissive material affixed on a substrate (e.g., as can be found in photonic circuits). Waveguide device 510 can further comprise one or more additional scattering feature 516. Scattering features 512 and 514, along with one or more additional scattering features 516 can be disposed in series along waveguide device 510. Temperature sensor 502 can further comprise an interrogator device 518. Interrogator device 518 can comprise a radiation source 520 and/or a detector 522. It should be appreciated that radiation source 520 and detector 522 need not be configured within a single interrogator (i.e., radiation source 520 and detector 522 can be arranged independent of each other). Temperature sensor 502 can further comprise one or more additional waveguide devices 524 thermally coupled to object 500. One or more additional waveguide devices 524 each can comprise scattering features 526 (e.g., as described with respect to scattering features 512, 514, and/or 516).

In some embodiments, temperature sensor 502 can be thermally coupled to object 500. For example, temperature sensor 502 can be in contact with object 500, temperature sensor 502 can be embedded inside a hollowed path of body 504 (as illustrated in FIG. 5A), temperature sensor 502 can be affixed to a surface of object 500, or the like. The hollowed path in body 504 can be manufactured using any suitable technique (e.g., drilled, molded, or the like).

Figure 6:
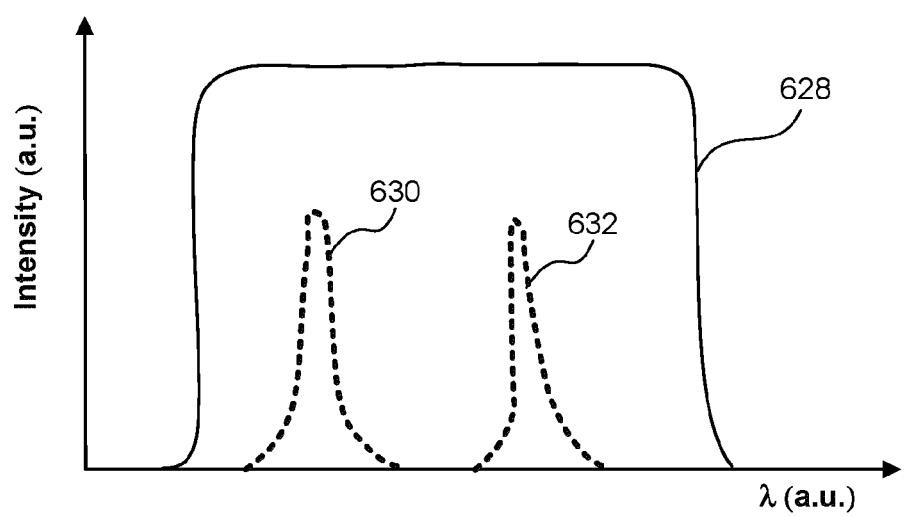
FIG. 6 illustrates an example graph of a spectrum of radiation generated by radiation source, according to some embodiments.

In some embodiments, radiation source 520 is configured to generate input radiation comprising at least first and second different spectra (e.g., at least first and second different wavelengths). FIG. 6 is briefly referred to for clarification, which shows an example graph of the spectrum of the input radiation generated by radiation source 520, according to some embodiments. The vertical axis of the graph represents radiation intensity in arbitrary units (a.u.) and the horizontal axis represents wavelength in arbitrary units (a.u.).

In some embodiments, the spectrum generated by radiation source 520 can be represented by wideband spectrum 628. Wideband spectrum 628 can be considered a superposition of a plurality of sub-spectra. Furthermore, radiation source 520 is not limited to generating wideband spectrum 628 all at once. For example, radiation source 520 can be a tunable laser having selectable sub-spectra. It should be appreciated that radiation source 520 being configured to generate wideband spectrum 628 can refer to embodiments in which wideband spectrum 628 is generated all at once or embodiments in which sub-spectra are generated at corresponding time intervals such that the aggregate of the radiation generated in the time intervals corresponds to wideband spectrum 628. Within the superposition, there can be a sub-spectrum 630 (e.g., a first spectrum) and a sub-spectrum 632 (e.g., a second spectrum) that is different from sub-spectrum 630. It should be appreciated that other sub-spectra (not shown) can be present in superposition with sub-spectrum 630 and sub-spectrum 632 that contribute to wideband spectrum 628. Sub-spectra can be considered as narrowband (e.g., a narrow wavelength range centered around a peak wavelength), a very narrow peak (e.g., delta-function-like), or the like.

Referring again to FIG. 5, in some embodiments, waveguide device 510 can comprise an input end 534 and a downstream end 536 (respectively proximal and distal relative to interrogator device 518, radiation source 520, and/or detector 522). One or more additional waveguides 524 can also comprise input and downstream ends that function as described herein with respect to input end 534 and downstream end 536. Input end 534 can be optically coupled to interrogator device 518, radiation source 520, and/or detector 522. Input end 534 can be configured to receive the input radiation generated by radiation source 520. Temperature sensor 502 can further comprise a termination device 538. Termination device 538 can comprise a detector 540 (e.g., an additional detector) and/or a radiation discarding device 542 (e.g., a beam dump).

In some embodiments, radiation with wideband spectrum 628 can travel downstream through waveguide device 510 and interact with the scattering features of waveguide device 510. For example, scattering feature 512 can be configured to reflect a sub-spectrum of wideband spectrum 628 (FIG. 6) based on a temperature at scattering feature 512. Radiation not reflected by scattering feature 512 is allowed to propagate downstream. The reflected sub-spectrum can be, for example, sub-spectrum 630 (FIG. 6).

It should be appreciated that, in some embodiments, the particular choice of reflected sub-spectrum described in the present example is not limiting. In some embodiments, the reflection properties of scattering features can be chosen based on design parameters of the scattering features (e.g., choice of materials, grating pitch, line width, or the like). It should also be appreciated that the radiation that is propagated past scattering feature 512 can comprise a spectrum involving wideband spectrum 628 minus sub-spectrum 630.

In some embodiments, the radiation that is propagated past scattering feature 512 can travel further downstream through waveguide device 510 to, e.g., interact with downstream structures (e.g., other scattering features and/or termination device 538). For example, scattering feature 514 can be configured to reflect a sub-spectrum of wideband spectrum 628 (FIG. 6) based on a temperature at scattering feature 514. Radiation not reflected by scattering feature 514 is allowed to propagate downstream. As a non-limiting example, the reflected sub-spectrum can be, for example (non-limiting), sub-spectrum 632 (FIG. 6). It should be appreciated that the radiation that is propagated past scattering feature 514 can comprise a spectrum received from scattering feature 512 minus sub-spectrum 632 (i.e., wideband spectrum 628 minus sub-spectra 630 and 632). The radiation that is propagated past scattering feature 512 can travel further downstream through waveguide device 510 to interact with downstream structures (e.g., other scattering features and/or termination device 538).

It should be appreciated that, in some embodiments, one or more additional scattering features 516 can be configured to function similar to scattering features 512 and 514 but with different sub-spectra. For example, one or more additional scattering features 516 can be configured to, based on temperatures at corresponding locations of one or more scattering features 516, reflect corresponding one or more additional sub-spectra while allowing non-reflected radiation to be propagated downstream. The scattering features can be configured such that the reflected sub-spectra are mutually different. In this manner, it is possible to discriminate the reflections and correlate each reflected sub-spectrum to the corresponding scattering feature.

In some embodiments, scattering features 512 and 514 and/or one or more additional scattering features 516 can each comprise a Bragg reflector. In some embodiments, waveguide device 510 can comprise an optical fiber. In this scenario, scattering features 512 and 514 and/or one or more additional scattering features 516 can each comprise a fiber Bragg grating.

Figure 7:
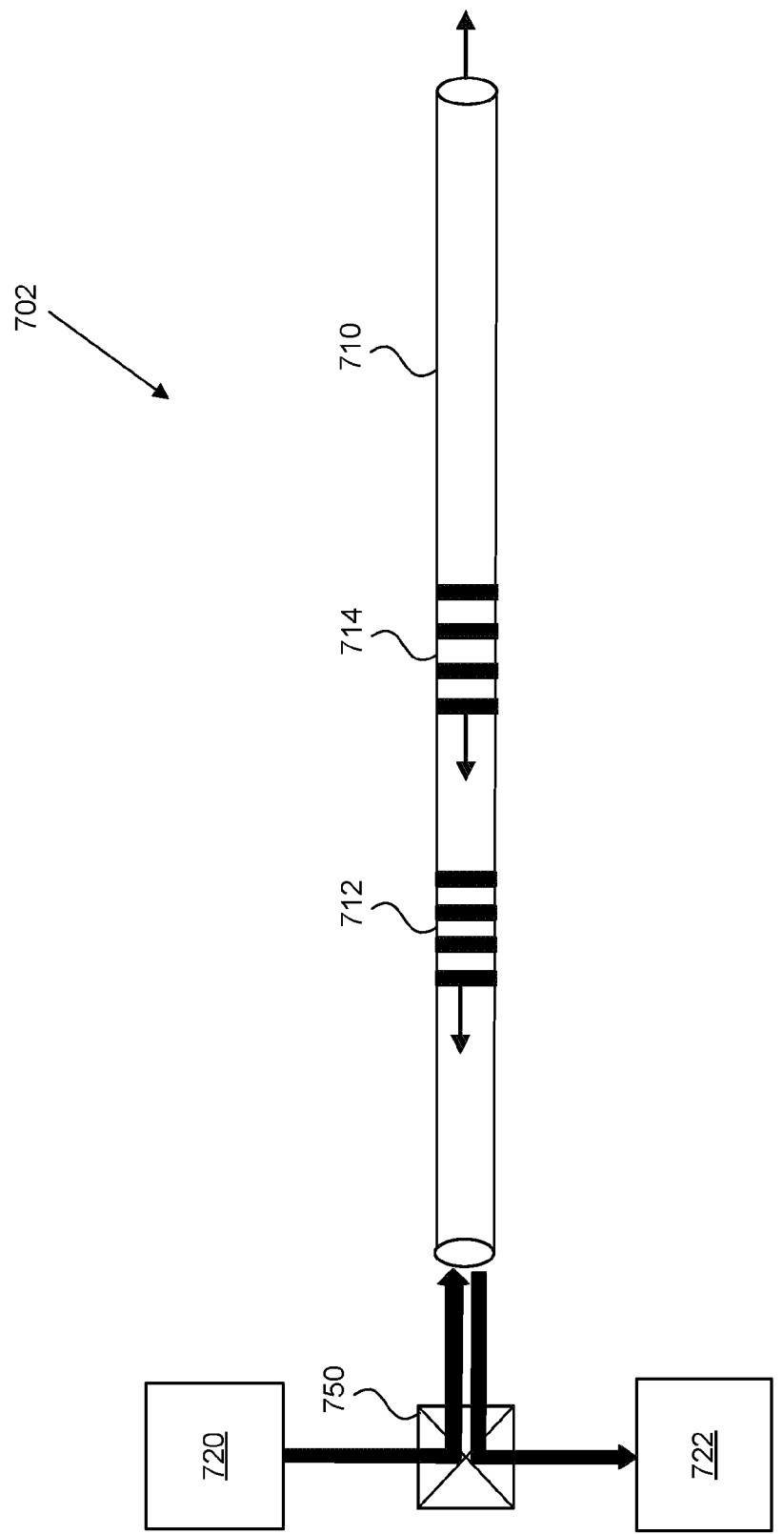
FIG. 7 illustrates a temperature sensor array, according to some embodiments.

Referring briefly to FIG. 7, a temperature sensor 702 is shown, according to some embodiments. In some embodiments, temperature sensor 702 can also represent a more detailed view of temperature sensor 502 (FIGS. 5A and 5B). Unless otherwise noted, elements of FIG. 7 that have similar reference numbers as elements of FIGS. 5A and 5B (e.g., reference numbers sharing the two right-most numeric digits) can have similar structures and functions. For simplicity, the similar structures, as well as structures that have been omitted from view (for drawing clarity), will not be reintroduced in detail.

In addition to structures and functions described in reference to temperature sensor 502 (FIGS. 5A and 5B), in some embodiments, temperature sensor 702 can also comprise an optical element 750. A radiation source 720 can generate radiation comprising wideband spectrum 628 (FIG. 6). Optical element 750 can be configured to direct the radiation from radiation source 720 toward an input end 734 of a waveguide device 710. Radiation having wideband spectrum 628 can be launched into waveguide device 710 via input end 734. A scattering feature 712 of waveguide device 710 can be configured to reflect a sub-spectrum of wideband spectrum 628 (FIG. 6) based on a temperature at scattering feature 712. Radiation not reflected by scattering feature 712 is allowed to propagate downstream. The reflected sub-spectrum can be, for example, sub-spectrum 630 (FIG. 6). It should be appreciated that a scattering feature 714 can have similar functions in reference to a different sub-spectrum (e.g., sub-spectrum 632 (FIG. 6)). It should also be appreciated that additional scattering features can be implemented for different sub-spectra.

In some embodiments, a detector 722 is disposed at or in proximity to input end 734. Optical element 750 can be further configured to direct reflected radiation to detector 722. The reflected radiation can comprise radiation having sub-spectra 630 and 632 (FIG. 6)—that is, radiation reflected by scattering features 712 and 714. Transmitted radiation can continued downstream to exit waveguide device 710 via a downstream end 736.

Referring again to FIG. 5, in some embodiments, detector 522 be disposed at input end 534 to receive radiation comprising the sub-spectra reflected by scattering features 512, 514, 516, and/or 526 (e.g., reflection of sub-spectra 630 and 632). Detector 522 can comprise a spectrometer, an oscilloscope, a spectrum analyzer, a wavelength-analyzing device, or the like. Disposing detector 522 so as to receive reflected sub-spectra from input end 534 can be desirable because the reflected sub-spectra can be measured directly. An indirect measurement can be to dispose detector to receive downstream radiation at downstream end 536 and analyze the missing sub-spectra that has been removed from the input radiation. However, the latter arrangement can be prone to uncertainties arising from attenuation and faulty scattering features, as well as increasing processing time to analyze the detected spectrum. In the context of radiation "reflected" by a scattering feature in a waveguide device, the terms "reflect," "reflected," "backscattered," or the like can be used to refer to radiation, originally propagating downstream, propagates upstream after interacting with the scattering feature.

In some embodiments, detector 522 can be configured to generate a measurement signal based on the received radiation comprising the sub-spectra reflected by the scattering features. The measurement signal can comprise temperature information corresponding to locations proximal to scattering features 512 and 514 and/or one or more additional scattering feature 516. Since waveguide devices can be fabricated much smaller than thermistors, a large number of scattering features can be distributed proximal to surface 506. For example, an optical fiber with fiber Bragg gratings (i.e., scattering features) can be fabricated with a cross-sectional dimension (e.g., diameter) in the order of 100 microns. The size requirements of waveguide devices can be orders of magnitude smaller than thermistors.

Therefore, in some embodiments, the scattering features provide a scalable solution for a temperature map. Scattering features can be made compact and arranged at very high densities compared to thermistors. Each scattering feature can be a pixel of a temperature map. In this manner, the measurement signal can comprise information of a high-resolution temperature map of surface 506—in contrast to the coarse 4-point thermistor setup in FIGS. 4A and 4B. In some embodiments, waveguide device 510 can be disposed curved such that it conforms to a curvature of surface 506.

In order to obtain a high-resolution temperature map of surface 506, in some embodiments, waveguide device 510 and one or more additional waveguide devices 524 can be arranged as shown in FIG. 5B. In this arrangement, one or more additional waveguide devices 524 can be disposed substantially parallel to, and spaced apart from, waveguide device 510. Scattering features 526 in each of one or more additional waveguide devices 524 can be configured to, based on temperatures at corresponding ones of the scattering features 526, reflect different spectra and to transmit radiation not reflected by the corresponding ones of the scattering features 526. Detector 522 can comprise additional measurement channels corresponding to one or more additional waveguides 524. In this manner, it is possible to make each of waveguide device 510 and one or more additional waveguides 524 identical or similar and while retaining location discrimination (e.g., pixel discrimination) by tagging the temperature information with a corresponding channel identifier.

In some embodiments, waveguide device 510 and one or more additional waveguide devices 524 can be arranged as shown in FIG. 5A. In this arrangement, one or more additional waveguide devices 524 can be disposed at one or more different depths within object 500. The one or more depths can be measured relative to surface 506 (or with respect to an averaged flat plane of surface 506 in the scenario that surface 506 is curved). In this manner, temperature sensor can be densely distributed throughout body.

In some embodiments, controller 544 (or another controller or processor) can receive the measurement signal from detector 522 and generate a high-resolution, two or three dimensional temperature map of object 500.

In some embodiments, waveguide devices 510 and/or 524 can be enclosed in object 500, as opposed to being affixed to a surface or slotted into a trench of object 500. A reason for having this arrangement can be that affixing waveguide device 510 onto a critical surface can hinder performance of the critical surface (e.g., attaching waveguide device onto a reflective surface will impact reflection performance). Another reason for having this arrangement can be that leaving open trenches for inserting waveguide device 510 into body 504 can cause structural stability issues in object 500. By surrounding all lateral sides of waveguide device 510 with the material of body 504, structural stability of object 500 is improved.

In some embodiments, waveguide device 510 can be disposed proximal to temperature-sensitive surface 506 (e.g., an optical surface) such that scattering features 512 and 514 are in thermal communication with different regions of the temperature-sensitive surface. In some embodiments, a length of waveguide device 510 can be disposed along a direction that is perpendicular to surface 506 (e.g., a temperature-sensitive surface). This arrangement can allow measurements of a temperature gradient in object 500 in a direction away (or toward) surface 506.

In some embodiments, waveguide devices 510 and/or 524 can have bends (e.g., an optical fiber can be bent up to its maximum bend radius). In some embodiments, waveguide devices 510 and/or 524 can be bend-insensitive optical fibers. In some embodiments, waveguide devices 510 and/or 524 can be arranged inside of object 500 in a spiral pattern. In some embodiments, waveguide devices 510 and/or 524 can be arranged inside of object 500 in a serpentine pattern. A reason for using these arrangements is to distribute sensing elements densely so as to allow high spatial resolution of temperature measurements. The example arrangements are not limiting and it should be appreciated that other arrangements, and combination of arrangements, can be used.

In some embodiments, the arrangements in shown in FIGS. 5A and 5B are combinable. For example, waveguide devices can be arranged in a "mesh" pattern. Waveguide devices at a first depth can be arranged as shown FIG. 5B. Then, at a second depth different from the first depth, waveguide devices can be arranged to run perpendicular (or at an angle) with respect to the direction of the waveguide devices in the first depth.

In some embodiments, a system (e.g., a lithographic system) that employs temperature sensor 502 can also comprise a controller 544 and a heating system 546. Heating system 546 can be part of a temperature control system that includes, not only heating system 546, but also other systems (e.g., a cooling system). Heating system can be configured to heat at least a portion of object 500. The heating can be targeted, for example, to specific areas of surface 506 where to reduce temperature unevenness of object 500 so as to prevent warping of surface 506. Controller 544 can be configured to receive the measurement signal from detector 522. Controller 544 can be further configured to generate a control signal based on the measurement signal. The temperature control system can receive the control signal from controller 544 to adjust a temperature of at least a portion of object 500 based on the received control signal. For example, the control signal can comprise instructions for heating system 546 to heat a specific region(s) of object 500—i.e., a feedback process. Though FIG. 5A shows heating system 546 as being remote (detached) from object 500, it should be appreciated that, in some embodiments, heating system 546 can comprise heating elements physically coupled to object 500 (e.g., heating electrodes (not shown)).

In some embodiments, heating system 546 can comprise a detached heating source (as illustrated in FIG. 5A). The heating source can comprise, for example, a radiation source. The heating source can comprise a laser or a plurality of lasers. The laser(s) can be configured to generate infrared radiation (IR). IR is a wavelength region that can be readily absorbed by objects as heat. The lasers can be configured to direct IR radiation to specific regions of object 500 based on the control signals received from controller 544.

In some embodiments, the radiation source of heating system 546 can be configured to provide input radiation to waveguide device 510, in lieu of or in addition to the radiation provided by radiation source 520. The radiation from the radiation source of heating system 546 can be routed to input end 534 of waveguide device 510 using, for example, an optical fiber. Input end 534 can be configured to receive the radiation from the radiation source of heating system 546.

In some embodiments, termination device 538, detector 540, and/or radiation discarding device 542 can be disposed at downstream end 536. Termination device 538 can be configured to receive radiation that has not been reflected by the scattering features of waveguide device 510. In order to prevent back reflections due to an improper termination of waveguide device 510, radiation discarding device 542 can be configured to discard radiation received from downstream end 536. The discarding mechanism can be, for example, energy dissipation using optical-to-heat energy conversion.

In some embodiments, detector 540 can be configured to receive the radiation transmitted through the periodic structures and to generate a measurement signal. A controller can be configured to receive the measurement signal and generate diagnostic information based on the measurement signal. The controller can be, for example, controller 544 or another controller (e.g., a processor that is part of another system). Detector 540 can comprise a spectrometer, an oscilloscope, a spectrum analyzer, a wavelength-analyzing device, or the like. The diagnostic information can include, for example, health of the radiation source that generates the input radiation (e.g., radiation source 520), status of scattering features (e.g., in working order, critical, failed), or the like. The diagnostic information can be further enhanced using a controller to compare radiation input at input end 534 and radiation output at downstream end 536.

In some embodiments, object 500 can be a deformable optical element—for example, a deformable mirror. In some embodiments, the control signal from controller 544 can comprise instructions to actuate portions of the deformable optical element. The deformable optical element can receive the control signal and adjust its shape based on the received control signal. In this manner, warping of the deformable optical element due to temperature variations can be compensated for by suitably shaping the deformable optical element.

Figure 8:
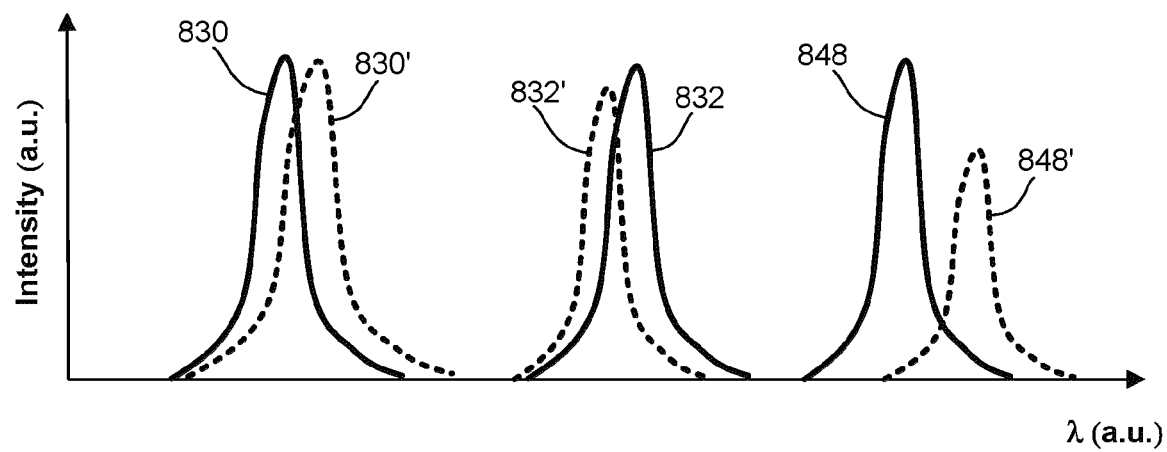
FIG. 8 illustrates a graph of example reflected sub-spectra, according to some embodiments.

It is desirable to accurately calibrate the reflective behavior of scattering features with respect to temperature. A change in temperature at a scattering feature can cause a measureable change to the reflected sub-spectrum. FIG. 8 shows a graph of example reflected sub-spectra, according to some embodiments. Unless otherwise noted, elements of FIG. 8 that have similar reference numbers as elements of FIG. 6 (e.g., reference numbers sharing the two right-most numeric digits) can have similar properties.

In some embodiments, a reflected sub-spectrum 830 can correspond to radiation reflected by scattering feature 512 (FIG. 5) at a given temperature. The region around scattering feature 512 (FIG. 5) can undergo temperature variations as previously described. Changes in temperature of scattering feature 512 (FIG. 5) can cause the reflected spectrum to change to that of a reflected sub-spectrum 830'. Changes to reflected sub-spectrum caused by changes in temperature can comprise, for example, a shift in center wavelength, a change in intensity, a change in bandwidth, or combinations thereof. For example, a changing temperature at scattering feature 514 (FIG. 5) can correspond to a reflected sub-spectrum 832 being shifted to a reflected sub-spectrum 832' having shorter wavelengths than reflected sub-spectrum 832. A reflected sub-spectrum 848 being shifted to a reflected sub-spectrum 848' can correspond to temperature changes at other scattering features.

In some embodiments described so far, scattering features 512, 514, 516, and/or 526 can comprise a purposely engineered scattering feature (e.g., a fiber Bragg grating). However, in some embodiments, scattering features 512, 514, 516, and/or 526 can be non-engineered features randomly formed during fabrication of waveguide device 510. For example, defects or non-conformities can randomly form during fabrication of a uniform optical fiber. The randomly formed defects or non-conformities can scatter light, effectively functioning as scattering features.

In some embodiments, scattering behavior of randomly formed scattering features can be difficult to quantify. However, detection methods can be implemented to compensate for the lack of predictable scattering behavior. For example, the input radiation launched into waveguide device 510 can be a predefined pulse (e.g., has a known timing, phase, and/or spectrum). Even if the exact locations of the randomly formed scattering features are unknown, the randomly formed scattering features can backscatter radiation toward detector 540. Then, the location of the scattering event in waveguide device 510 can be determined based on an analysis of the time-of-flight of the input radiation and the subsequently returned backscattered radiation. Since, the locations of randomly formed scattering features can be ubiquitous throughout waveguide device 510, temperature sensor 502 can effectively be a continuous temperature sensor, as opposed to a discretized temperature sensor.

In some embodiments, the sub-spectra corresponding to a plurality of backscattering events can depend on the temperature at corresponding locations of waveguide device 510. The backscattered sub-spectra can be analyzed using any suitable wavelength/frequency analysis methods. As non-limiting examples, the measurement signal generated by detector 540 can be analyzed using optical time domain reflectometry (OTDR) or optical frequency domain reflectometry (OFDR).

Figure 9:
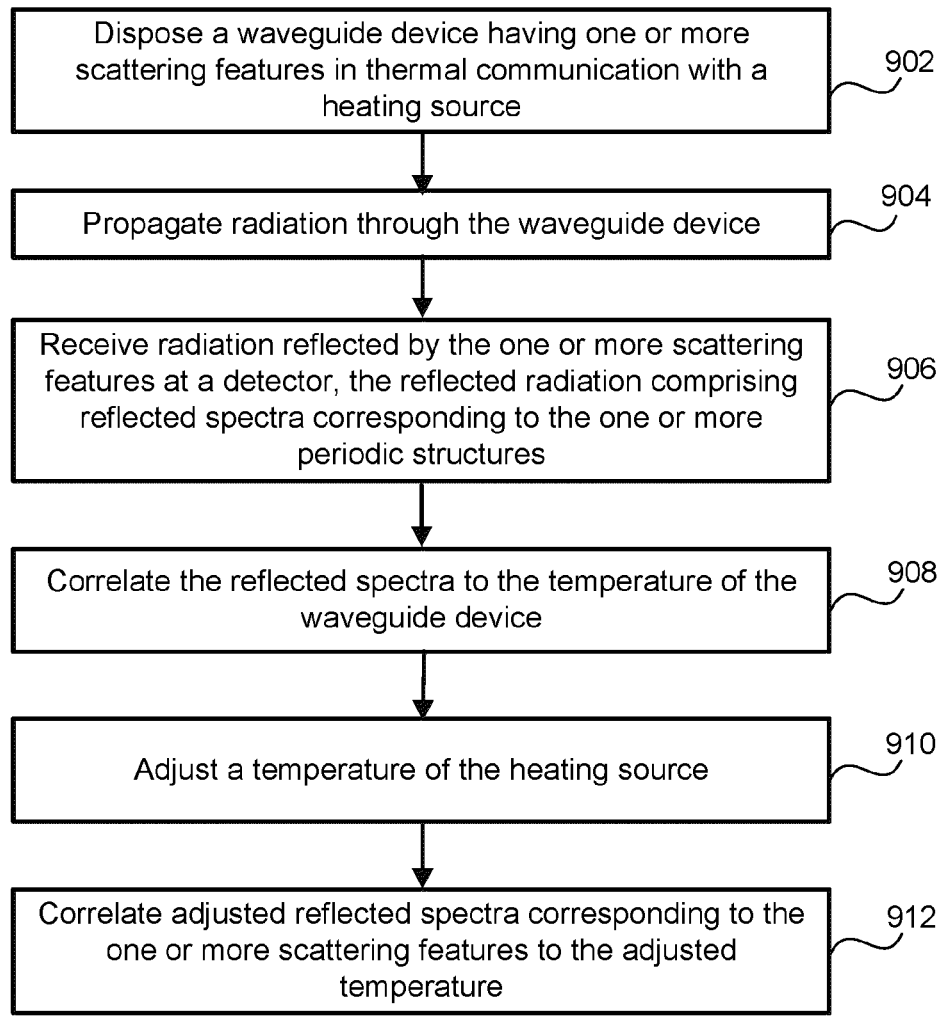
FIG. 9 shows method steps for calibrating the temperature response of scattering features, according to some embodiments.

FIG. 9 shows method steps for calibrating the temperature response of scattering features, according to some embodiments. The calibration process can involve correlating different states of reflected spectra to corresponding temperatures of a scattering feature. At step 902, a waveguide device having one or more scattering features is disposed in thermal communication with a heating source (e.g., disposed in an oven). At step 904, radiation is propagated through the waveguide device. At step 906, radiation reflected by the one or more scattering features is received at a detector. At step 908, reflected spectra are correlated to the temperature of the waveguide device (i.e., the temperature of the scattering feature(s)). At step 910, a temperature is adjusted by adjusting the heating source. At step 912, adjusted reflected spectra corresponding to the one or more scattering features are correlated to the adjusted temperature of the waveguide device. The process is repeated for a plurality of temperatures. In this manner, the temperature response of each scattering feature can be quantified. In some embodiments, the temperature response of each scattering feature can be programmed into controller 544 (FIG. 5). Furthermore, the calibration method steps of FIG. 9 can be applied to both purposely engineered and randomly formed scattering features.

In some embodiments, the method steps of FIG. 9 can be performed in any conceivable order and it is not required that all steps be performed. Moreover, the method steps of FIG. 9 described above merely reflect an example of steps and are not limiting. That is, further method steps and functions can be envisioned based embodiments described in the present disclosure.

Figure 10:
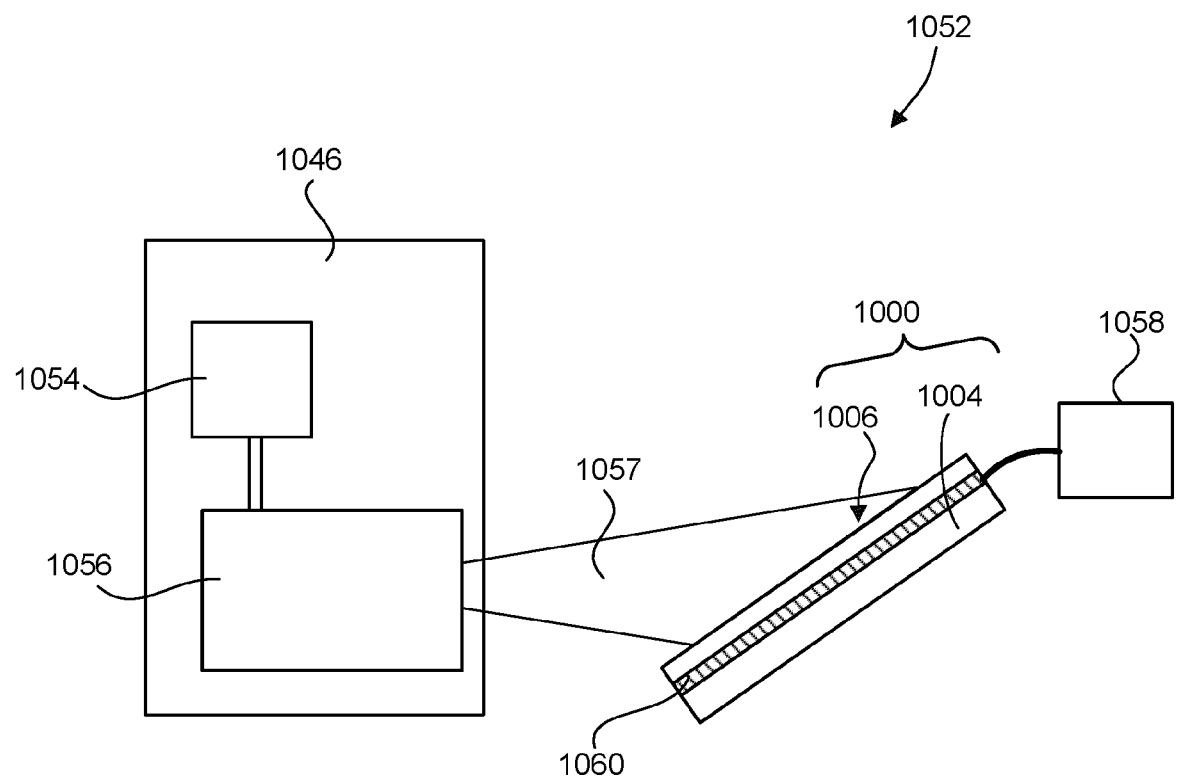
FIG. 10 shows a temperature control system, according to some embodiments.

With respect to some embodiments described earlier, it was recognized that heating system 546 can be part of a temperature control system that includes, not only heating system 546, but also other systems (e.g., a cooling system). FIG. 10 shows a temperature control system 1052, according to some embodiments. In some embodiments, temperature control system can be implemented in embodiments having a temperature-sensitive object (e.g., in FIGS. 5A, 5B, and 7). Unless otherwise noted, elements of FIG. 10 that have similar reference numbers as elements of FIGS. 5A, 5B, and 7 (e.g., reference numbers sharing the two right-most numeric digits) can have similar structures and functions. For simplicity, the similar structures, as well as structures that have been omitted from view (for drawing clarity), will not be reintroduced in detail.

In some embodiments, temperature control system 1052 can comprise a heating system 1046 and/or a cooling system 1058, all of which can be configured to adjust a temperature of at least a portion of an object 1000. The adjusting of the temperature at specific locations of object 1000 allows reduction of temperature unevenness and subsequent reduction of adverse effects (e.g., warping of a surface). Object 1000 can be a temperature-sensitive object. Object 1000 can comprise a body 1004 and a surface 1006 (e.g., a temperature-sensitive surface).

In some embodiments, heating system 1046 can comprise a radiation source 1054 and an optical system 1056. Radiation source 1054 can generate radiation 1057 for irradiating at least a portion of object 1000. Optical system 1056 can direct radiation 1057 toward object 1000. Optical system 1056 can include any number and combination of optical elements—for example, mirror(s), digital micromirror device(s), lens(es), prism(s), or the like (not shown). It should be appreciated that optical system 1056 can be used to direct radiation 1057 to irradiate a large area of surface 1006 (as shown in FIG. 10) or specific portions of surface 1006 based on feedback data provided by a temperature sensor (e.g., temperature sensor 502).

In some embodiments in which radiation 1057 is to be used for sourcing a temperature sensor, optical system 1056 can be used to direct at least a portion of radiation 1057 toward an input end of a waveguide device (e.g., input end 534 of waveguide device 510 (FIG. 5)) as the input radiation. The input radiation can comprise a plurality of sub-spectra as described in reference to FIGS. 6 and 8.

In some embodiments, object 1000 can further comprise one or more fluid channels 1060. One or more fluid channels 1060 can be disposed at a depth underneath surface 1006 (e.g., at a depth measured relative to surface 1006). Though FIG. 10 shows a flat surface 1006 and a flat plane for one or more fluid channels 1060, it should be appreciated that the plane of one or more fluid channels 1060 can be curved. For example, if surface 1006 is bowl-shaped, one or more fluid channels 1060 can be curved so as to conform to a shape of surface 1006 in order to provide uniform cooling.

In some embodiments, one or more fluid channels 1060 can be fluidically coupled to cooling system 1058. One or more fluid channels 1060 can be used to flow a cooling fluid from cooling system 1058. While heating system 1046 can inject heat into object 1000 so as to reduce temperature unevenness, the cooling fluid flowed through fluid channels 1060 can remove heat from object 1000 to allow more heat management options (e.g., prevent overheating, stabilize temperatures, achieve steady-state, remove heat from specific regions, or the like).

Figure 11A:
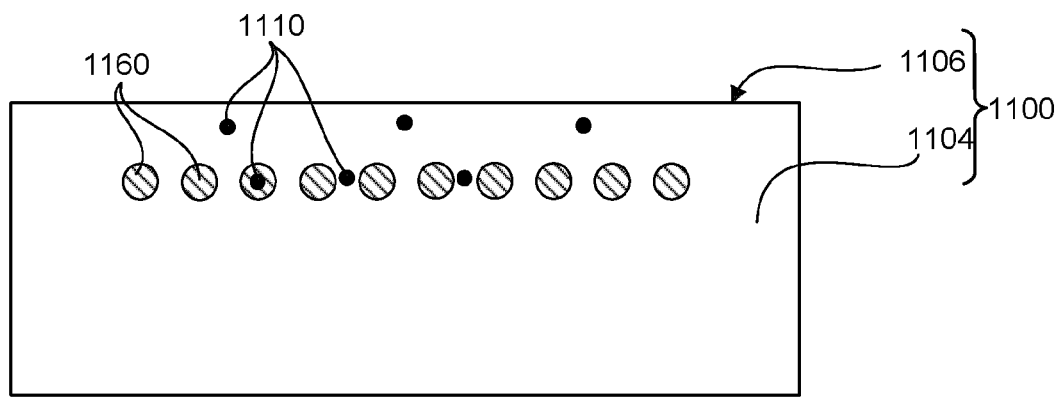
FIGS. 11A and 11B show an object serviced by a cooling system and a temperature sensor, according to some embodiments.
Figure 11B:
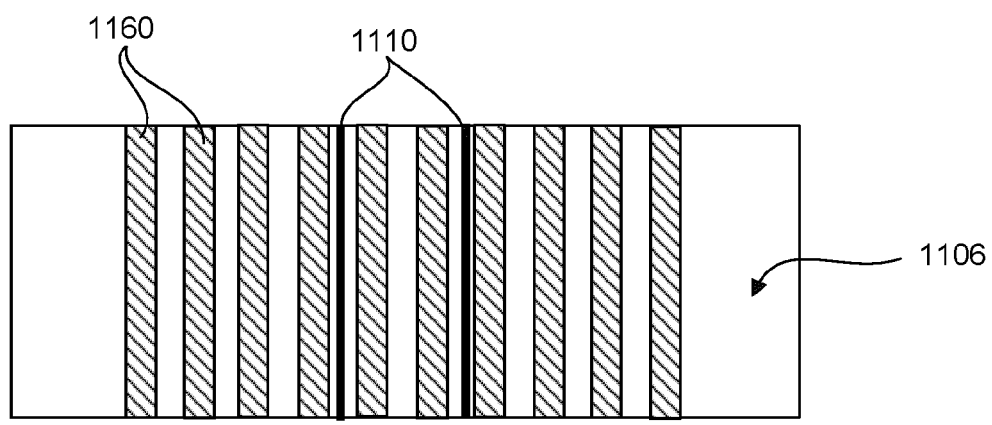

FIGS. 11A and 11B show an object 1100 serviced by a cooling system and a temperature sensor, according to some embodiments. Unless otherwise noted, elements of FIG. 11 that have similar reference numbers as elements of FIGS. 5A, 5B, 7, and 10 (e.g., reference numbers sharing the two right-most numeric digits) can have similar structures and functions. For simplicity, the similar structures, as well as structures that have been omitted from view (for drawing clarity), will not be reintroduced in detail. FIG. 11A illustrates a side view and the arrangement of one or more waveguide devices 1110 relative to the side view. FIG. 11B illustrates a see-through frontal view of surface 1106 and the arrangement of one or more waveguide devices 1110 relative to the frontal view. FIGS. 5A and 5B illustrate alternative or combinable arrangements (e.g., waveguides at different depths and/or side-by-side).

In some embodiments, the temperature sensor comprises one or more waveguide devices 1110, which can have structures and functions as described with respect to FIGS. 5A, 5B, and 6-10. Object 1100 can comprise one or more fluid channels 1160. FIG. 11A shows different possible (and combinable) dispositions of one or more waveguide devices 1110 within object 1100. In some embodiments, one or more waveguide devices 1110 can be disposed in a hollowed path of object 1100 at a depth that is between the surface 1106 and the depth of one or more fluid channels 1160. A length of one or more waveguide devices 1110 can be oriented parallel to one or more fluid channels 1160 (as shown in FIG. 11B) or perpendicular to one or more fluid channels 1160 (not shown). This arrangement allows high-resolution temperature mapping of surface 1106 alongside implementation of one or more fluid channels 1160 for cooling object 1100. Cooling fluid from cooling system 1058 (FIG. 10) can be flowed through one or more fluid channels 1160.

In some embodiments, one or more waveguide devices 1110 can be disposed in at least one of one or more fluid channels 1160. This arrangement allows temperature measurements of the temperature of the cooling fluid flowing in one or more fluid channels 1160.

In some embodiments, a length of one or more waveguide devices 1110 can be oriented perpendicular to surface 1106 (not shown). This arrangement allows temperature measurement of a temperature gradient between surface 1106 and one or more fluid channels 1160. This can be particularly useful for determining if object 1100 has achieved a stable temperature (e.g., a steady-state) or if temperatures are still fluctuating. A lithographic apparatus using this method to manage temperature of critical optical components can determine how much pause to allow between exposures of high-intensity radiation used in lithographic processes, thereby maximizing fabrication throughput. Temperature control using heating system 1046 (FIG. 10) and/or cooling system 1058 (FIG. 10) can be performed simultaneously in parallel to exposure operations in a lithographic device, as opposed to performing the functions alternatingly.

In some embodiments, the different arrangements of one or more waveguide devices 1110 can be combined with each other and/or with arrangements described with respect waveguide device 510 (FIG. 5) (e.g., see spiral pattern, serpentine pattern, different depths, or the like).

Referring again to FIG. 5, in some embodiments, a temporal resolution of temperature sensor 502 can be approximately 10 second or less, 5 seconds or less, 1 second or less, or 0.1 second or less. In some embodiments, a spatial resolution of temperature sensor 502 can be approximately 100 mm or less, 50 mm or less, 25 mm or less, 10 mm or less, 5 mm or less, or 1 mm or less. In some embodiments, an accuracy of a temperature measurement performed by temperature sensor 502 can be within approximately 1 degree centigrade or less, 0.5 degree centigrade or less, or 0.1 degree centigrade or less.

The embodiments may further be described using the following clauses:

1. A lithographic apparatus comprising:
   an illumination system configured to illuminate a pattern of a patterning device;
   a projection system configured to project an image of the pattern onto a substrate;
   a temperature-sensitive object; and
   a temperature sensor thermally coupled to the temperature sensitive-object, wherein the temperature sensor comprises:
      a waveguide device comprising:
         an input end configured to receive input radiation;
         a downstream end opposite the input end;
         a first scattering feature configured to reflect a first spectrum based on a temperature at the first scattering feature, wherein radiation not reflected by the first scattering feature is allowed to propagate downstream; and
         a second scattering feature configured to reflect a second spectrum based on a temperature at the second scattering feature, wherein radiation not reflected by the second scattering feature is allowed to propagate downstream; and
      a detector disposed to receive radiation comprising the reflected first and second spectra from the input end and configured to generate a measurement signal based on the received radiation.

2. The lithographic apparatus of clause 1, wherein:
   the first scattering feature is further configured such that the reflected first spectrum changes based on a temperature change at the first scattering feature; and
   the second scattering feature is further configured such that the reflected second spectrum changes based on a temperature change at the second scattering feature.

3. The lithographic apparatus of clause 1, wherein:
   the temperature sensor further comprises a radiation source configured to generate the input radiation; and
   the input radiation comprises the first and second spectra.

4. The lithographic apparatus of clause 1, wherein the waveguide device is enclosed in the temperature-sensitive object and a length of the waveguide device is disposed along a direction perpendicular to a temperature-sensitive surface of the temperature-sensitive object.

5. The lithographic apparatus of clause 1, wherein the temperature-sensitive object is an optical element or a support structure in the lithographic apparatus.

6. The lithographic apparatus of clause 5, wherein the waveguide device is enclosed in the optical element and is disposed proximal to an optical surface of the optical element such that the first and second scattering features are in thermal communication with different regions of the optical surface.

7. The lithographic apparatus of clause 5, further comprising a controller configured to receive the measurement signal and to generate a control signal based on the measurement signal, wherein the optical element comprises a deformable mirror configured to receive the control signal and to adjust shape based on the received control signal.

8. The lithographic apparatus of clause 1, wherein the first and second scattering features are each a Bragg reflector.

9. The lithographic apparatus of clause 1, wherein the waveguide device is an optical fiber and the first and second scattering features are each a fiber Bragg grating.

10. The lithographic apparatus of clause 1, wherein the waveguide device is arranged in a spiral pattern.

11. The lithographic apparatus of clause 1, wherein the waveguide device is arranged in a serpentine pattern.

12. The lithographic apparatus of clause 1, wherein:
    the temperature sensor further comprises one or more additional waveguide devices thermally coupled to the temperature-sensitive object;
    the one or more additional waveguide devices each comprises scattering features configured to reflect corresponding spectra based on temperatures at corresponding ones of the scattering features;
    radiation not reflected by the corresponding ones of the scattering features is allowed to propagate downstream; and
    the one or more additional waveguide devices are disposed parallel to, and spaced apart from, the waveguide device.

13. The lithographic apparatus of clause 1, wherein:
    the temperature sensor further comprises one or more additional waveguide devices thermally coupled to the temperature-sensitive object;
    the one or more additional waveguide devices each comprises scattering features configured to reflect corresponding spectra based on temperatures at corresponding ones of the scattering features;
    radiation not reflected by the corresponding ones of the scattering features is allowed to propagate downstream; and
    the one or more additional waveguide devices are disposed at corresponding one or more depths, the one or more depths measured relative to an a temperature-sensitive surface of the temperature-sensitive object, but different from a depth of the waveguide device.

14. The lithographic apparatus of clause 1, further comprising a controller configured to receive the measurement signal and to generate a two or three dimensional map of temperature of the temperature-sensitive object based on the received measurement signal.

15. The lithographic apparatus of clause 1, further comprising:
    a controller configured to receive the measurement signal and to generate a control signal based on the measurement signal; and
    a temperature control system configured to receive the control signal and to adjust a temperature of at least a portion of the temperature-sensitive object based on the received control signal.

16. The lithographic apparatus of clause 15, wherein the temperature control system comprises a heating system configured to heat at least the portion of the temperature-sensitive object based on the control signal to reduce a temperature unevenness of the temperature-sensitive object.

17. The lithographic apparatus of clause 15, wherein:
the heating system comprises a radiation source configured to generate radiation to irradiate at least the portion of the temperature-sensitive object;
an optical system configured to direct a portion of the radiation from the radiation source to the input end of the waveguide device as the input radiation; and
the portion of the radiation from the radiation source comprises the first and second spectra.

18. The lithographic apparatus of clause 15, wherein:
the temperature control system comprises a cooling system configured to adjust a temperature of at least the portion of the temperature-sensitive object based on the control signal; and
the temperature-sensitive object comprises one or more fluid channels configured to flow a cooling fluid from the cooling system.

19. The lithographic apparatus of clause 18, wherein the cooling system is configured to adjust a temperature of at least the portion of the temperature-sensitive object based on the control signal.

20. The lithographic apparatus of clause 18, wherein:
the one or more fluid channels are disposed at a depth measured relative to a temperature-sensitive surface of the temperature-sensitive object; and
the waveguide device is disposed in a hollowed path of the temperature-sensitive object at a depth that is between the temperature-sensitive surface and the depth of the one or more fluid channels.

21. The lithographic apparatus of clause 18, wherein the waveguide device is disposed in at least one of the one or more fluid channels.

22. The lithographic apparatus of clause 1, wherein the temperature sensor further comprises an additional detector disposed at the downstream end of the waveguide device configured to receive radiation propagated past the first and second scattering features and to generate another measurement signal.

23. The lithographic apparatus of clause 22, further comprising a controller configured to receive the another measurement signal and to generate diagnostic information about the temperature sensor based on the another measurement signal.

24. The lithographic apparatus of clause 1, wherein the temperature sensor further comprises a radiation discarding device at the downstream end of the waveguide device configured to discard radiation transmitted through the waveguide device.

25. A system comprising:
a temperature-sensitive object;
a temperature sensor thermally coupled to the temperature sensitive-object, wherein the temperature sensor comprises:
a waveguide device comprising:
an input end configured to receive input radiation;
a downstream end opposite the input end;
a first scattering feature configured to reflect a first spectrum based on a temperature at the first scattering feature, wherein radiation not reflected by the first scattering feature is allowed to propagate downstream;
a second scattering feature configured to reflect a second spectrum based on a temperature at the second scattering feature, wherein radiation not reflected by the second scattering feature is allowed to propagate downstream; and
a detector disposed to receive radiation comprising the reflected first and second spectra from the input end and to generate a measurement signal based on the received radiation; and
a controller configured to receive the measurement signal and to generate a control signal based on the measurement signal.

26. The system of clause 25, further comprising a temperature control system configured to receive the control signal and to adjust a temperature of at least a portion of the temperature-sensitive object based on the received control signal.

27. The system of clause 25, wherein:
the first scattering feature is further configured such that the reflected first spectrum changes based on a temperature change at the first scattering feature; and
the second scattering feature is further configured such that the reflected second spectrum changes based on a temperature change at the second scattering feature.

28. The system of clause 25, wherein:
the temperature sensor further comprises a radiation source configured to generate the input radiation; and
the input radiation comprises the first and second spectra.

29. The system of clause 25, wherein the waveguide device is an optical fiber and the first and second scattering features are fiber Bragg gratings.

30. The system of clause 25, wherein the temperature sensor further comprises an additional detector disposed at the downstream end of the waveguide device configured to receive radiation that has propagated past the first and second scattering features and to generate another measurement signal.

31. The system of clause 30, wherein the controller is further configured to generate diagnostic information about the temperature sensor based on the another measurement signal.

32. The system of clause 25, wherein the system is a lithographic apparatus.

33. The system of clause 25, wherein:
the temperature sensor further comprises one or more additional waveguide devices thermally coupled to the temperature-sensitive object;
the one or more additional waveguide devices each comprises scattering features configured to reflect corresponding spectra based on temperatures at corresponding ones of the scattering features;
radiation not reflected by the corresponding ones of the scattering features is allowed to propagate downstream; and
the one or more additional waveguide devices are disposed parallel to, and spaced apart from, the waveguide device.

34. The lithographic apparatus of clause 25, wherein the controller is further configured to generate a two or three dimensional map of temperature of the temperature-sensitive object based on the received measurement signal.

35. The system of clause 25, wherein the waveguide device is disposed in a hollowed path inside of the temperature-sensitive object and disposed proximal to temperature-sensitive surface of the temperature-sensitive object such that the first and second scattering features are in thermal communication with different regions of the temperature-sensitive surface.

36. The system of clause 25, wherein the detector is further configured to determine a location of the first scattering feature in the temperature-sensitive object based on a time-of-flight of radiation received at the detector comprising the first spectrum.

37. A method comprising:
disposing a waveguide device having one or more scattering features in thermal communication with a heating source;
propagating radiation through the waveguide device;
receiving radiation reflected by the one or more scattering features at a detector, the reflected radiation comprising reflected spectra corresponding to the one or more scattering features;
correlating the reflected spectra to the temperature of the waveguide device;
adjusting a temperature of the heating source; and
correlating adjusted reflected spectra corresponding to the one or more scattering features to the adjusted temperature.

While EUV lithographic apparatuses were described earlier, it should be appreciated that, in some embodiments, any lithographic apparatus (e.g., deep ultraviolet types), as well as other non-lithographic systems in unrelated technology spaces, can implement temperature measurement and control solutions described in embodiments herein.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," or the like as used herein may encompass all types of electromagnetic radiation, for example, ultraviolet (UV) radiation (for example, having a wavelength k of 365, 248, 193, 157 or 126 nm), extreme ultraviolet (EUV or soft X-ray) radiation (for example, having a wavelength in the range of 5-100 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. A lithographic apparatus comprising:
an illumination system configured to illuminate a pattern of a patterning device;
a projection system configured to project an image of the pattern onto a substrate;
a temperature-sensitive object; and
a temperature sensor thermally coupled to the temperature sensitive-object, wherein the temperature sensor comprises:
a waveguide device comprising:
an input end configured to receive input radiation;
a downstream end opposite the input end;
a first scattering feature configured to reflect a first spectrum based on a temperature at the first scattering feature, wherein radiation not reflected by the first scattering feature is allowed to propagate downstream; and
a second scattering feature configured to reflect a second spectrum based on a temperature at the second scattering feature, wherein radiation not reflected by the second scattering feature is allowed to propagate downstream;
a detector disposed to receive radiation comprising the reflected first and second spectra from the input end and configured to generate a measurement signal based on the received radiation; and
a controller configured to receive the measurement signal and to generate a control signal based on the measurement signal,
wherein the temperature-sensitive object comprises a deformable mirror configured to receive the control signal and to adjust shape based on the received control signal.

2. The lithographic apparatus of claim 1, wherein:
the first scattering feature is further configured such that the reflected first spectrum changes based on a temperature change at the first scattering feature; and
the second scattering feature is further configured such that the reflected second spectrum changes based on a temperature change at the second scattering feature.

3. The lithographic apparatus of claim 1, wherein:
the temperature sensor further comprises a radiation source configured to generate the input radiation; and
the input radiation comprises the first and second spectra.

4. The lithographic apparatus of claim 1, wherein the waveguide device is enclosed in the temperature-sensitive object and a length of the waveguide device is disposed along a direction perpendicular to a temperature-sensitive surface of the temperature-sensitive object.

5. The lithographic apparatus of claim 1, wherein the waveguide device is enclosed in the deformable mirror and is disposed proximal to an optical surface of the deformable mirror such that the first and second scattering features are in thermal communication with different regions of the optical surface.

6. The lithographic apparatus of claim 1, wherein the first and second scattering features are each a Bragg reflector.

7. The lithographic apparatus of claim 1, wherein the waveguide device is an optical fiber and the first and second scattering features are each a fiber Bragg grating.

8. The lithographic apparatus of claim 1, wherein the waveguide device is arranged in a spiral pattern.

9. The lithographic apparatus of claim 1, wherein the waveguide device is arranged in a serpentine pattern.

10. A lithographic apparatus comprising:
an illumination system configured to illuminate a pattern of a patterning device;
a projection system configured to project an image of the pattern onto a substrate;
a temperature-sensitive object; and
a temperature sensor thermally coupled to the temperature sensitive-object, wherein the temperature sensor comprises:
a waveguide device comprising:
an input end configured to receive input radiation;
a downstream end opposite the input end;
a first scattering feature configured to reflect a first spectrum based on a temperature at the first scattering feature, wherein radiation not reflected by the first scattering feature is allowed to propagate downstream;
a second scattering feature configured to reflect a second spectrum based on a temperature at the second scattering feature, wherein radiation not reflected by the second scattering feature is allowed to propagate downstream; and
a detector disposed to receive radiation comprising the reflected first and second spectra from the input end and configured to generate a measurement signal based on the received radiation;
wherein:
the temperature sensor further comprises one or more additional waveguide devices thermally coupled to the temperature-sensitive object;
the one or more additional waveguide devices each comprises scattering features configured to reflect corresponding spectra based on temperatures at corresponding ones of the scattering features;
radiation not reflected by the corresponding ones of the scattering features is allowed to propagate downstream; and
the one or more additional waveguide devices are disposed parallel to, and spaced apart from, the waveguide device.

11. A lithographic apparatus comprising:
an illumination system configured to illuminate a pattern of a patterning device;
a projection system configured to project an image of the pattern onto a substrate;
a temperature-sensitive object; and
a temperature sensor thermally coupled to the temperature sensitive-object, wherein the temperature sensor comprises:
a waveguide device comprising:
an input end configured to receive input radiation;
a downstream end opposite the input end;
a first scattering feature configured to reflect a first spectrum based on a temperature at the first scattering feature, wherein radiation not reflected by the first scattering feature is allowed to propagate downstream; and a second scattering feature configured to reflect a second spectrum based on a temperature at the second scattering feature, wherein radiation not reflected by the second scattering feature is allowed to propagate downstream; and a detector disposed to receive radiation comprising the reflected first and second spectra from the input end and configured to generate a measurement signal based on the received radiation;

wherein:

the temperature sensor further comprises one or more additional waveguide devices thermally coupled to the temperature-sensitive object;

the one or more additional waveguide devices each comprises scattering features configured to reflect corresponding spectra based on temperatures at corresponding ones of the scattering features;

radiation not reflected by the corresponding ones of the scattering features is allowed to propagate downstream; and the one or more additional waveguide devices are disposed at corresponding one or more depths, the one or more depths measured relative to a temperature-sensitive surface of the temperature-sensitive object, but different from a depth of the waveguide device.

12. A lithographic apparatus comprising:

an illumination system configured to illuminate a pattern of a patterning device;

a projection system configured to project an image of the pattern onto a substrate;

a temperature-sensitive object; and a temperature sensor thermally coupled to the temperature sensitive-object, wherein the temperature sensor comprises:

a waveguide device comprising:

an input end configured to receive input radiation;

a downstream end opposite the input end;

a first scattering feature configured to reflect a first spectrum based on a temperature at the first scattering feature, wherein radiation not reflected by the first scattering feature is allowed to propagate downstream; and a second scattering feature configured to reflect a second spectrum based on a temperature at the second scattering feature, wherein radiation not reflected by the second scattering feature is allowed to propagate downstream;

a detector disposed to receive radiation comprising the reflected first and second spectra from the input end and configured to generate a measurement signal based on the received radiation; and a controller configured to receive the measurement signal and to generate a two or three dimensional map of temperature of the temperature-sensitive object based on the received measurement signal.

13. A lithographic apparatus comprising:

an illumination system configured to illuminate a pattern of a patterning device;

a projection system configured to project an image of the pattern onto a substrate;

a temperature-sensitive object; and a temperature sensor thermally coupled to the temperature sensitive-object, wherein the temperature sensor comprises:

a waveguide device comprising:

an input end configured to receive input radiation;

a downstream end opposite the input end;

a first scattering feature configured to reflect a first spectrum based on a temperature at the first scattering feature, wherein radiation not reflected by the first scattering feature is allowed to propagate downstream; and a second scattering feature configured to reflect a second spectrum based on a temperature at the second scattering feature, wherein radiation not reflected by the second scattering feature is allowed to propagate downstream;

a detector disposed to receive radiation comprising the reflected first and second spectra from the input end and configured to generate a measurement signal based on the received radiation;

a controller configured to receive the measurement signal and to generate a control signal based on the measurement signal; and a temperature control system configured to receive the control signal and to adjust a temperature of at least a portion of the temperature-sensitive object based on the received control signal.

14. The lithographic apparatus of claim 10, wherein the temperature-sensitive object is an optical element or a support structure in the lithographic apparatus.

15. The lithographic apparatus of claim 11, wherein the temperature-sensitive object is an optical element or a support structure in the lithographic apparatus.

16. The lithographic apparatus of claim 12, wherein the temperature-sensitive object is an optical element or a support structure in the lithographic apparatus.

17. The lithographic apparatus of claim 13, wherein the temperature-sensitive object is an optical element or a support structure in the lithographic apparatus.

* * * * *